(12) United States Patent
Nguyen et al.

(10) Patent No.: US 8,130,031 B2
(45) Date of Patent: Mar. 6, 2012

(54) TUNABLE METAMATERIAL

(75) Inventors: Vinh N. Nguyen, Durham, NC (US); Nan Marie Jokerst, Hillsborough, NC (US); David R. Smith, Durham, NC (US); Talmage Tyler, II, Holly Springs, NC (US); Jungsang Kim, Chapel Hill, NC (US); Serdar H. Yonak, Ann Arbor, MI (US)

(73) Assignees: Toyota Motor Engineering & Manufacturing North America, Inc., Aichi (JP); Duke University, Durham, NC (US)

( * ) Notice: Subject to any disclaimer, the term of this patent is extended or adjusted under 35 U.S.C. 154(b) by 581 days.

(21) Appl. No.: 12/361,056

(22) Filed: Jan. 28, 2009

(65) Prior Publication Data

US 2011/0175672 A1 Jul. 21, 2011

(51) Int. Cl.
*H01L 25/00* (2006.01)
(52) U.S. Cl. .................................................... 327/565
(58) Field of Classification Search .................. 327/530, 327/534, 564, 565
See application file for complete search history.

(56) References Cited

U.S. PATENT DOCUMENTS

| | | | |
|---|---|---|---|
| 7,106,494 B2 | 9/2006 | Osipov et al. | |
| 7,826,504 B2 * | 11/2010 | Chen et al. | 372/43.01 |
| 8,044,556 B2 * | 10/2011 | Masmanidis et al. | 310/330 |

OTHER PUBLICATIONS

Landy, N.I.; Hou-Tang Chen; OHara, J.F.; Zide, J.M.O.; Gossard, A.C.; Highstrete, C.; Lee, M.; Taylor, A.J.; Averitt, R.D.; Padilla, W.J., "Metamaterials for Novel Terahertz and Millimeter Wave Devices," International Symposium on Signals, Systems and Electronics, 2007, Jul. 30, 2007-Aug. 2, 2007, pp. 151-156.
Chen, H.T., Padilla, Willie J., Averitt, Richard D., Gossard, Arthur C., Highstrete, Clark, Lee, Mark, O'Hara, John F., Taylor, Antoinette J., "Electromagnetic Metamaterials for Terahertz Applications," Terahertz Science and Technology, vol. 1, No. 1, Mar. 2008, pp. 42-50.
Chen, H.T., Padilla, Willie J., Zide, Joshua M.O., Gossard, Arthur, Taylor, Antoinette J., "Active terahertz metamaterial devices," Nature, vol. 444 (30), Nov. 2006, pp. 597-600.

* cited by examiner

*Primary Examiner* — Jeffrey Zweizig
(74) *Attorney, Agent, or Firm* — Gifford, Krass, Sprinkle, Anderson & Citkowski, P.C.

(57) ABSTRACT

Examples of the present invention include a metamaterial comprising a plurality of resonators disposed on a substrate, the substrate comprising a dielectric support layer and a relatively thin semiconductor layer, having a Schottky junction between at least one conducting resonator and the semiconductor layer. The properties of the resonator may be adjusted by modifying the physical extent of a depletion region associated with the Schottky junction.

23 Claims, 9 Drawing Sheets

TUNABLE METAMATERIAL

FIELD OF THE INVENTION

The invention relates to metamaterials, in particular tunable metamaterials.

BACKGROUND OF THE INVENTION

Tunable metamaterials allow electromagnetic properties to be adjusted, for example using an applied electric field. Metamaterials are useful for numerous applications, such as radar devices.

SUMMARY OF THE INVENTION

Examples of the present invention include metamaterials having a Schottky junction between a conducting resonator and a semiconductor substrate layer. An example metamaterial comprises a plurality of resonators, each resonator including a conducting pattern, for example formed by a metal film. The resonators are supported by a substrate, the substrate comprising a support layer which forms the majority of the substrate thickness, and a semiconductor layer. The resonators are supported by the semiconductor layer, and the semiconductor layer is disposed on the support layer. The semiconductor may be doped, using one or more dopants such as those known in the art, to provide a desired current carrier concentration.

In some examples, the support layer comprises a glass, in particular a borosilicate glass such as Pyrex®. The support layer has a relatively thin semiconductor (e.g. silicon) layer disposed thereon. For example, the thickness of the semiconductor layer may be between 0.1 and 100 microns, more particularly between 0.1 and 10 microns, and in some examples between 1 and 4 microns, such as approximately 2 microns. The thickness of the support layer may be any thickness providing the required mechanical stability, and the support layer may be at least 5 times thicker than the semiconductor layer, and in some examples more than 10 times thicker.

An example metamaterial comprises a plurality of resonators, each resonator supported by a semiconductor layer, the metal of the resonators and the semiconductor material forming a Schottky junction. The electromagnetic properties of the metamaterial can be adjusted by varying a bias voltage between the resonator and the semiconductor layer. A depletion region has a variable extent which is a function of bias voltage and carrier concentration. Using a suitable carrier concentration, the depletion region may vary as a function of applied potential so as to provide adjustable electromagnetic properties at a frequency or frequencies of interest.

An example metamaterial comprises a substrate, and a plurality of resonators supported by the substrate. The substrate includes a support layer and a semiconductor layer, the support layer not being a semiconductor material. The support layer may be a dielectric layer, such as a glass or polymer, having low loss at frequencies of interest. The semiconductor layer may comprise a doped inorganic semiconductor, such as silicon, gallium arsenide, or other semiconductor material. The electromagnetic properties of the metamaterial can be adjusted by varying a bias voltage applied between a resonator and a semiconductor layer.

Resonators may comprise a patterned electrically conducting film supported by the substrate. A resonator may be an electrically-coupled inductor-capacitor (ELC) resonator, including at least one capacitor. A capacitor may have a separation between capacitor electrodes (for example, formed by proximate portions of a patterned metal film), which may be termed a capacitive gap. At least one capacitor electrode may be in electrical contact with the semiconductor layer, so as to form a Schottky junction with the semiconductor layer. By adjusting an electrical potential (voltage) between the resonator and the semiconductor layer, the properties of the resonator may be adjusted.

A resonator electrical connection can be provided in electrical contact with the resonator. There may be a single electrical connection for each resonator, or in other examples an electrical connection may be in electrical communication with all resonators within a group of resonators (for example, a column of resonators). A resonator electrical connection may electrically interconnect a group of resonators, such as a row or column, and may use part of the resonator for this purpose.

A bias connection can be provided in electrical communication with the semiconductor layer. For example, this may comprise a metal stripe. The semiconductor layer may be a doped semiconductor layer having a spatial distribution of charge carriers (free charge carriers due to a dopant), and a bias voltage applied between the bias connection and the resonator electrical connection modifies the electromagnetic properties of the resonator, by modifying the distribution of charge carriers in the semiconductor layer.

A depletion region proximate a Schottky junction between a metal resonator and a semiconductor layer may have a variable extent correlated with an applied bias voltage. For low or zero bias voltages, the semiconductor layer may appreciably modify the resonator property (compared with that obtained without the semiconductor layer) by providing a parallel conducting path across the capacitive gap and effectively shorting out the capacitor. However, by forming a depletion region in the semiconductor layer, the shorting effect can be eliminated. The extent of the depletion region is correlated with the magnitude of an applied bias voltage. The depletion region may then act so as to reduce or substantially eliminate the shorting effect of the semiconductor layer on the capacitive gap.

A substrate may comprise a support layer and a semiconductor layer as parallel layers in a multilayer substrate. In some examples, semiconductor layers may be patterned layers disposed on the support layer, and resonators located on the substrate so that the patterned semiconductor layer is proximate a capacitive gap, for example so that a semiconductor layer extends under both capacitor electrodes and across the capacitive gap between the electrodes.

The thickness of the semiconductor layer may be less than the thickness of the support layer, and in some examples may be at least an order of magnitude less (i.e. approximately equal to less than $\frac{1}{10}$ of the support layer thickness).

For example, for operation in the frequency range 60 GHz-100 GHz, the semiconductor layer may have relatively poor loss properties and may not be a suitable substrate for a metamaterial. However, the semiconductor layer may be relatively thin, compared to the support layer, so that the losses need not be appreciable. The semiconductor layer may have a thickness between 0.1 microns and 10 microns, for example between 1 microns and 4 microns. All ranges given in this specification are inclusive.

In some examples, the semiconductor layer comprises silicon, and may be a doped silicon layer, and the support layer is a glass layer or a liquid crystal polymer layer.

The resonator may comprise an electrically coupled inductor capacitor (ELC) resonator comprising a patterned metal film. The resonator, bias connection, and the resonator electrical connection may be generally coplanar, for example formed by etching a metal film deposited on the substrate. The thickness of the semiconductor layer may be less than the gap thickness of the capacitor. The semiconductor layer may be a patterned layer disposed proximate to the capacitive gap.

A plurality of resonators may be arranged in an array on the substrate. Each resonator may be individually addressed using a bias line and electrical connection, or in some cases a column or other group of resonators within an array may share a bias line and electrical connection. Each resonator in a column may be electrically interconnected, and the electrical potential of the resonators relative one or more semiconductor layers may be adjusted using a bias line. A gradient index lens for radar applications may comprise a metamaterial according to an embodiment of the present invention.

For example, the metamaterial may be a component of an automotive radar, other radar device, imaging apparatus, and the like. A substrate may comprise a thin layer of n-type doped silicon supported by a thicker support layer of Corning Pyrex® 7740 glass. A thin layer of n-type doped silicon can also be bonded to an LCP (liquid crystal polymer), to provide a substrate for a tunable metamaterial lens.

A method of adjusting electromagnetic properties of a metamaterial, for example including a plurality of electrically coupled inductor capacitor (ELC) resonators supported on a substrate comprises adjusting an electrical potential between at least one resonator and a semiconductor layer within the substrate, so as to modify a spatial distribution of charge carriers within the semiconductor layer, for example by excluding charge carriers from a depletion region of the semiconductor layer proximate a capacitive gap (or capacitor electrode thereof) one or more resonators. Exclusion of charge carriers adjusts the electromagnetic properties of the resonator, and hence the metamaterial, by changing the impedance through the semiconductor layer parallel to the capacitor.

DETAILED DESCRIPTION OF THE PREFERRED EMBODIMENTS

Figure 1A:
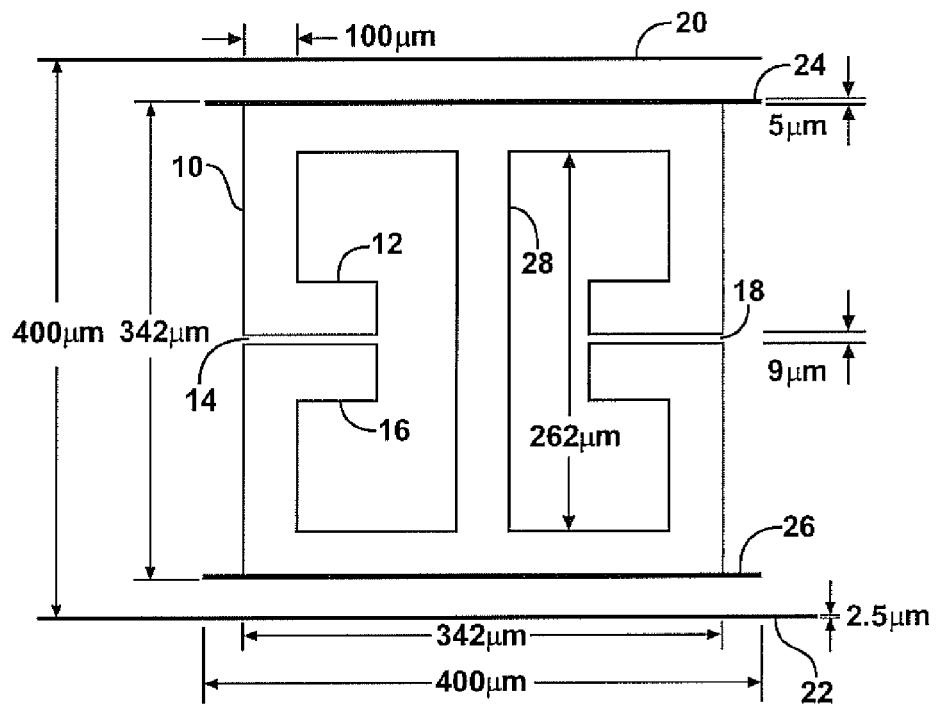
FIG. 1A shows an example resonator and bias lines.

The invention relates generally to metamaterials, for example metamaterials having adjustable properties through the application of a variable electrical bias between a metal resonator and an underlying semiconductor layer.

An example metamaterial comprises a substrate including a low loss support layer, having low dielectric loss at a frequency of operation. A semiconductor layer is disposed on the support layer. The support layer may provide most or all of the mechanical strength of the substrate. The semiconductor layer may have significantly more loss than the support layer at the operational frequency. However the semiconductor layer thickness can be reduced so that losses are acceptable. For example, the semiconductor layer thickness may be approximately 10 microns or less, for example approximately 2 microns. A plurality of resonators is supported by the semiconductor layer. For example, each resonator may comprise a conducting pattern, for example formed by a metal film. The conducting pattern and semiconductor layer form a Schottky junction. Under appropriate electrical bias, a depletion region is formed between the conducting pattern and the semiconductor layer as charge carriers within the semiconductor layer are driven away from the conducting pattern. By adjusting a bias voltage between the resonator and the semiconductor layer, a variable width depletion region can be formed.

In some examples, the resonator includes a capacitive gap. Under a first applied potential, the capacitive gap may be effectively shorted out by charge carriers in a doped semiconductor layer. However, through the application of a bias voltage, the charge carriers may be excluded from the capacitive gap. In this way, a structure which may be effectively switched between a structure including a capacitor and a structure in which the capacitor is shorted out can be obtained. The properties of the metamaterial may be adjusted dynamically by varying the potential of the conducting pattern relative to the semiconductor layer.

In a representative example, a metamaterial unit cell can be patterned in metal (e.g. aluminum) on top of an n-doped layer of semiconductor (e.g. n-doped silicon). A metal (e.g. aluminum) contact is also patterned on the semiconductor, proximate the resonator. The junction between the resonator and the semiconductor forms a Schottky junction. The junction between the bias connection and the semiconductor may be an Ohmic contact.

When no bias voltage is applied between the contact and to resonator, the conductivity of the doped semiconductor effectively shorts out the capacitive gap, disabling it. When a positive voltage is applied to the contact relative to the resonator, the Schottky junction formed by the contact and the semiconductor is forward biased while the Schottky junction formed by the resonator and the semiconductor is reverse biased. As a result, charge carriers (free electrons for n-doped semiconductor) are pulled out of the semiconductor beneath the unit cell. This creates a low-conductivity depletion region beneath the resonator and allows the capacitor to function. By adjusting the magnitude of the bias voltage, the strength of the unit cell resonance can be controlled. This in turns allow for the voltage-controlled adjustment of the electromagnetic properties of the resonator, and hence that of a metamaterial comprising a plurality of such resonators.

In other examples, a p-doped semiconductor layer can also be used, in which case the charge carriers are holes and a positive bias voltage can be used to form the depletion region around the resonator, in particular proximate and/or within the capacitive gap.

FIG. 1A shows a resonator formed from conducting pattern 10, including a capacitor formed between resonator portions 12 and 16, which act as the capacitor electrodes and which are separated by a capacitive gap 14. In this example, the resonator has two capacitive gaps, shown at 14 and 18, and also a central conducting strip 28. The central strip 28, and other parts of the resonator have a self-inductance that together with the capacitive gaps provides a resonator. The figure shows example dimensions in microns, but these are exemplary and not limiting.

In some examples of the present invention, a variable bias voltage between bias connections shown at 20 and 22 and the resonator 10 is used to adjust the electromagnetic properties of a metamaterial comprising a plurality of such resonators. In some examples, the resonators within a single row or column (the terms row and column are interchangeable) may be varied in unison by connecting together adjacent resonators through electrical connections provided by conducting lines such as those shown at 24.

The figure shows a unit cell which can be repeated in a square array over a substrate. Bias connections may be 5 microns wide, and in this example the unit cell includes half each of two bias connections to preserve symmetry. Bias connections (and electrical connections to resonators) can be narrow, for example having a width between 1 micron and 10 microns inclusive, to minimize effects on electromagnetic radiation.

Figure 1B:
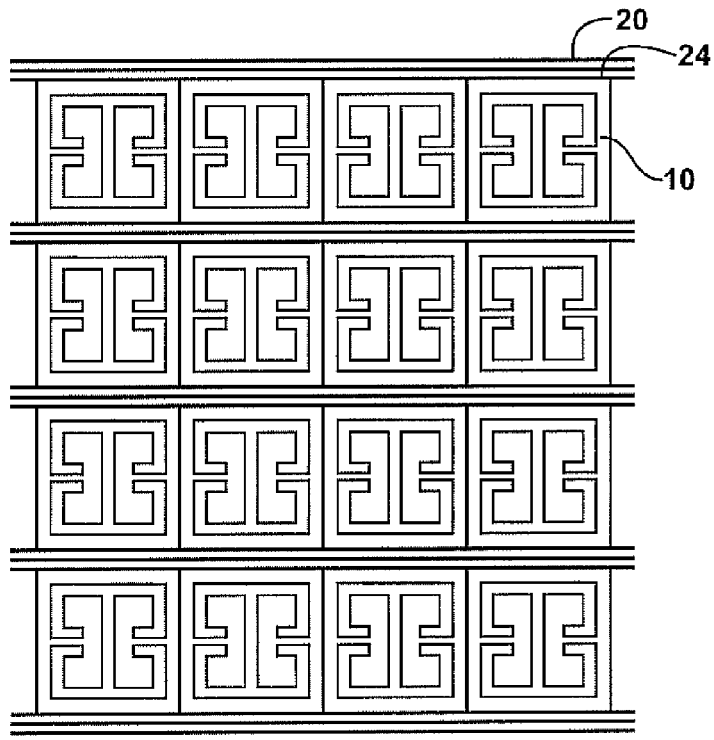
FIG. 1B shows an arrangement of resonators.

FIG. 1B shows an arrangement of resonators 10 on a substrate, with electrical connections such as 24 and bias connections such as 20. Resonators may be arranged in an array, and may be addressed individually (including use of matrix addressing methods), or by row or column. The terms row and column are equivalent.

Figure 2A:
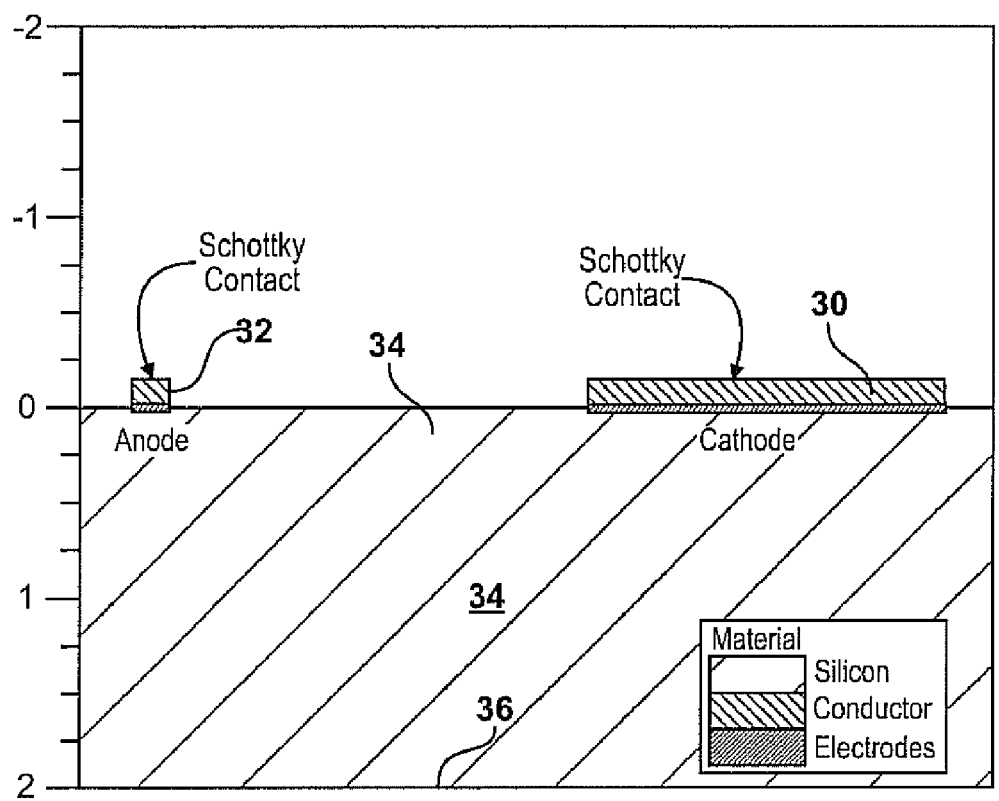
FIG. 2A shows a model structure, including a semiconductor layer and a Schottky junction formed by an electrode.

FIG. 2A shows a model structure comprising a conducting element 30 which forms a Schottky junction with the semiconductor layer, a bias contact 32 (which may correspond to the bias connections 20 and 22 in FIG. 1A), and a semiconductor layer 34. In this example the semiconductor layer has a thickness of 2 microns. In a metamaterial, a support layer may be located at the lower surface of the semiconductor, as shown at 36. The support layer may be a generally inert layer, for example a dielectric material having relatively low loss at frequencies of interest. Example support layers include glass, polymer, and the like.

Figure 2B:
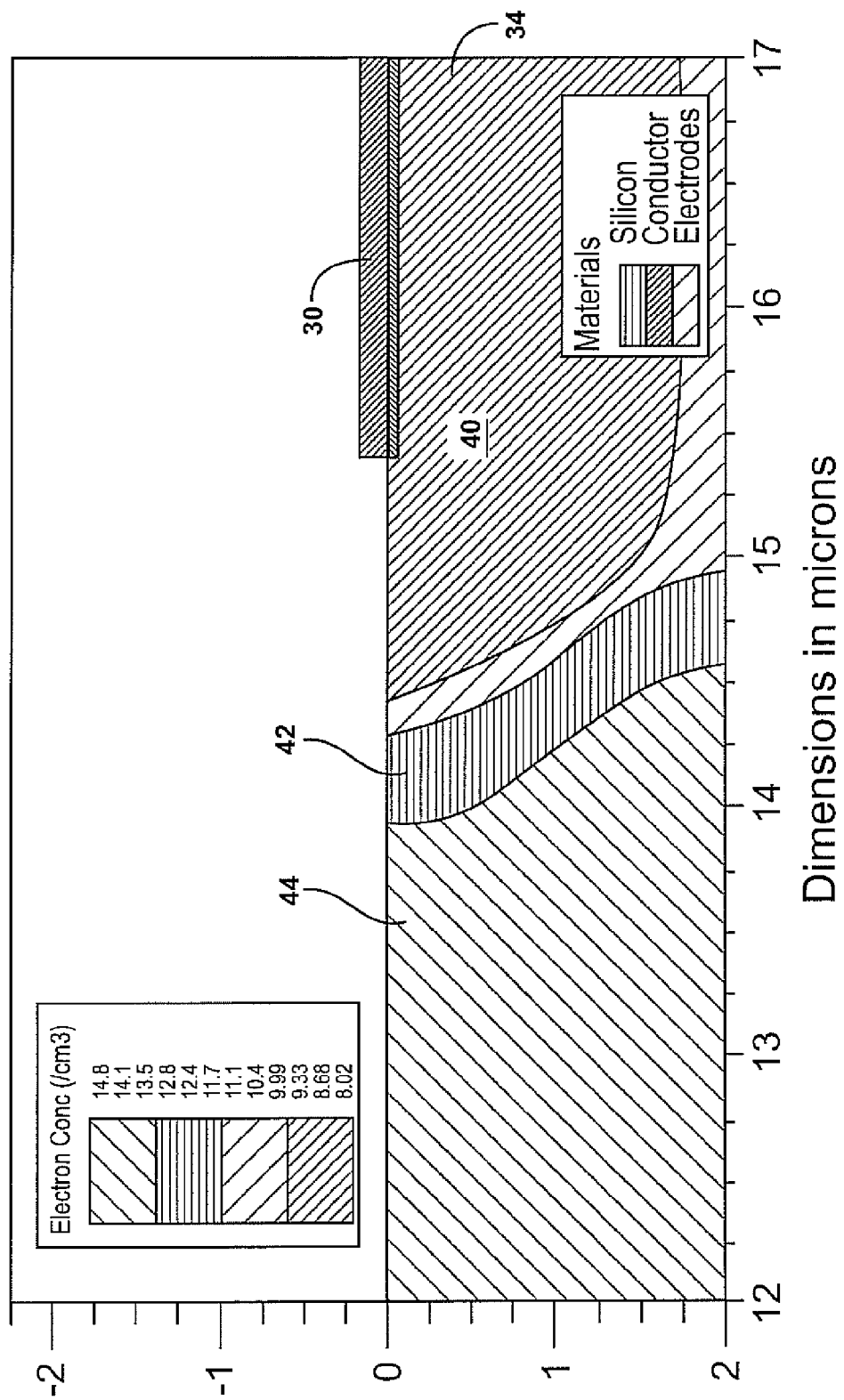
FIG. 2B shows a charge carrier concentration distribution for a bias voltage of 5 volts, showing the extent of a depletion region extending from the Schottky junction.

FIG. 2B shows the variation in carrier concentration within the depletion region. The figure shows Schottky junction 30, which may correspond to a portion of the resonator 10 in FIG. 1A. The Schottky junction 30 is disposed on semiconductor layer 34, as shown in FIG. 2A. The semiconductor layer is doped, so that without any applied potential the current carrier concentration is generally uniform over the semiconductor with a very small depletion region at the metal-semiconductor interface, and is determined by the dopant concentration. However, the application of a bias voltage, in this example, 5 volts, causes a wider depletion region to form around the Schottky junction. In a metamaterial, this corresponds to a depletion region forming around the edges of the patterned electrically conducting material of the resonator.

The contours of carrier concentration curve around the depletion region 40, as shown at 42, and a depletion region edge (or depletion boundary) separates the depletion region and the full carrier concentration region at 44. A depletion factor can be defined as the free carrier concentration divided by dopant concentration (for dopants providing one free carrier per dopant atom), and the depletion boundary can correspond to a depletion factor of 0.5. The depletion boundary is moved within the semiconductor layer by variation of the bias voltage.

Figure 2C:
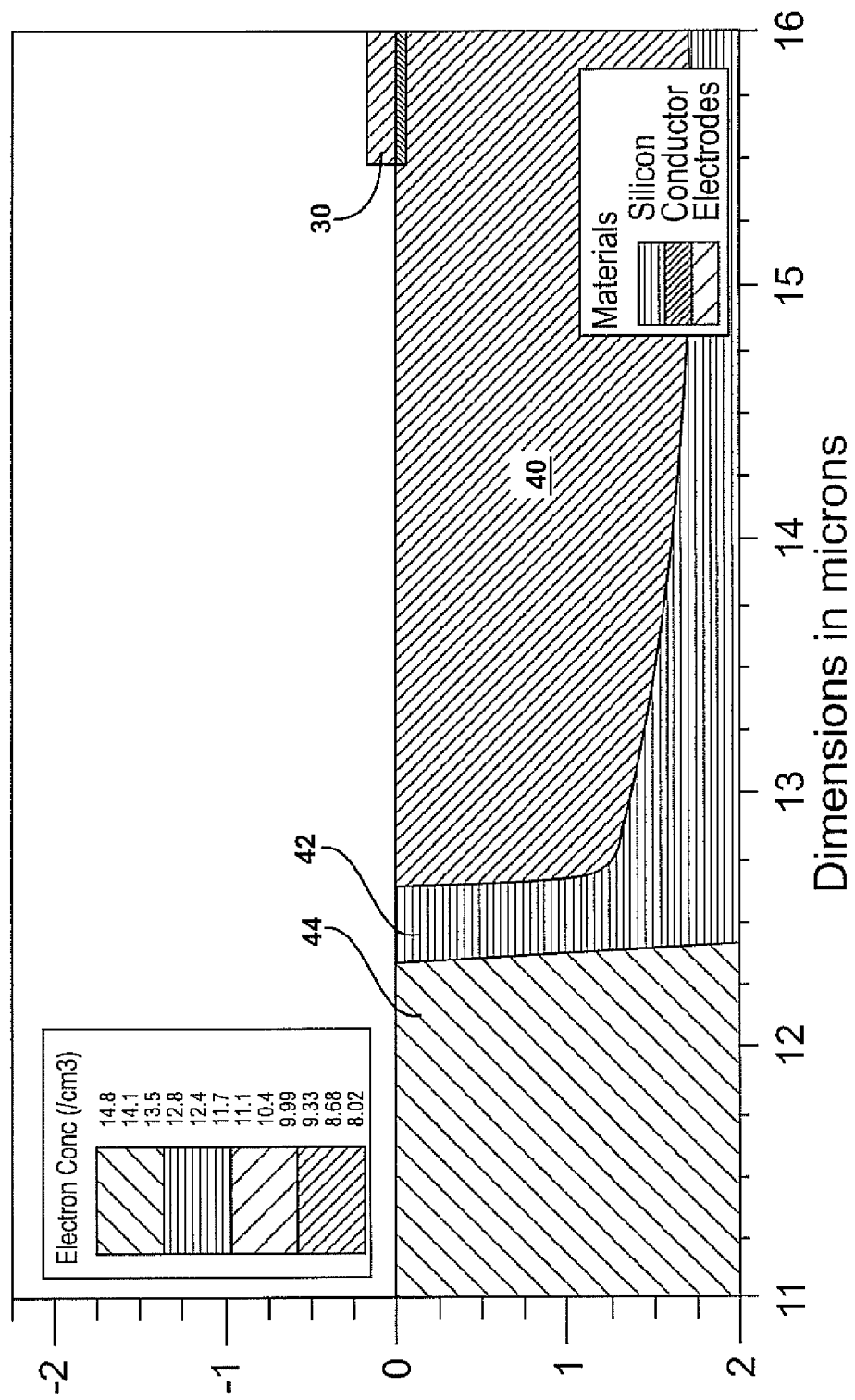
FIG. 2C shows a charge carrier concentration distribution at a bias voltage of 15 volts.

FIG. 2C illustrates the effect of a higher applied bias voltage, in this example 15 volts, which causes the depletion region 40 to extend further from the edge of the Schottky junction 30. In this example the carrier concentration contours are concentrated around region 42 as shown and the depletion boundary (between the depletion region and semiconductor with higher current carrier concentrations) is pushed away from the resonator edge. In a metamaterial, the depletion boundary moves further away from the edge of the resonator.

The effect of a depletion region forming around the resonator may be generally minor for most of the resonator, but appreciable effects are be observed for depletion region formation and growth within the capacitive gap. For low or zero bias voltage, the current carrier concentration between the Schottky junctions may allow a significantly low resistance between the capacitor electrodes of the capacitive gap, for example between 12 and 16 in FIG. 1A. In this case, a portion of the doped semiconductor layer effectively shorts out the capacitive gap 14. However, enlargement of the depletion region caused by increasing the magnitude of the bias voltage can eliminate this capacitor shorting effect.

The effective resistance parallel to the capacitor is increased, for example, when depletion region extends further through the semiconductor layer, for example through the thickness of the semiconductor layer. Also, for example, if the depletion region extends approximately half the distance of the capacitive gap, then the depletion regions extending from each capacitor electrode effectively meet in the middle, and there is a very high resistance between the capacitor electrodes. If the parallel resistance effect on the capacitor is substantially eliminated, the resonator will function similarly to a conventional metamaterial on an inert substrate.

Electromagnetic properties of metamaterials comprising a plurality of such adjustable resonators were simulated. Simulation assumptions included total carrier depletion up to the depletion boundary, rectangular depletion profiles with rounded corners, and undepleted silicon resistivity of 0.53 ohm·cm. Simulated resonators comprised platinum film of thickness 0.5 microns, the support layer was Pyrex® 7740, support layer thickness was 500 microns, semiconductor layer thickness was 1 micron, and the resonator was configured for a resonance frequency of approximately 67 GHz (on a lossless substrate).

Figure 3A:
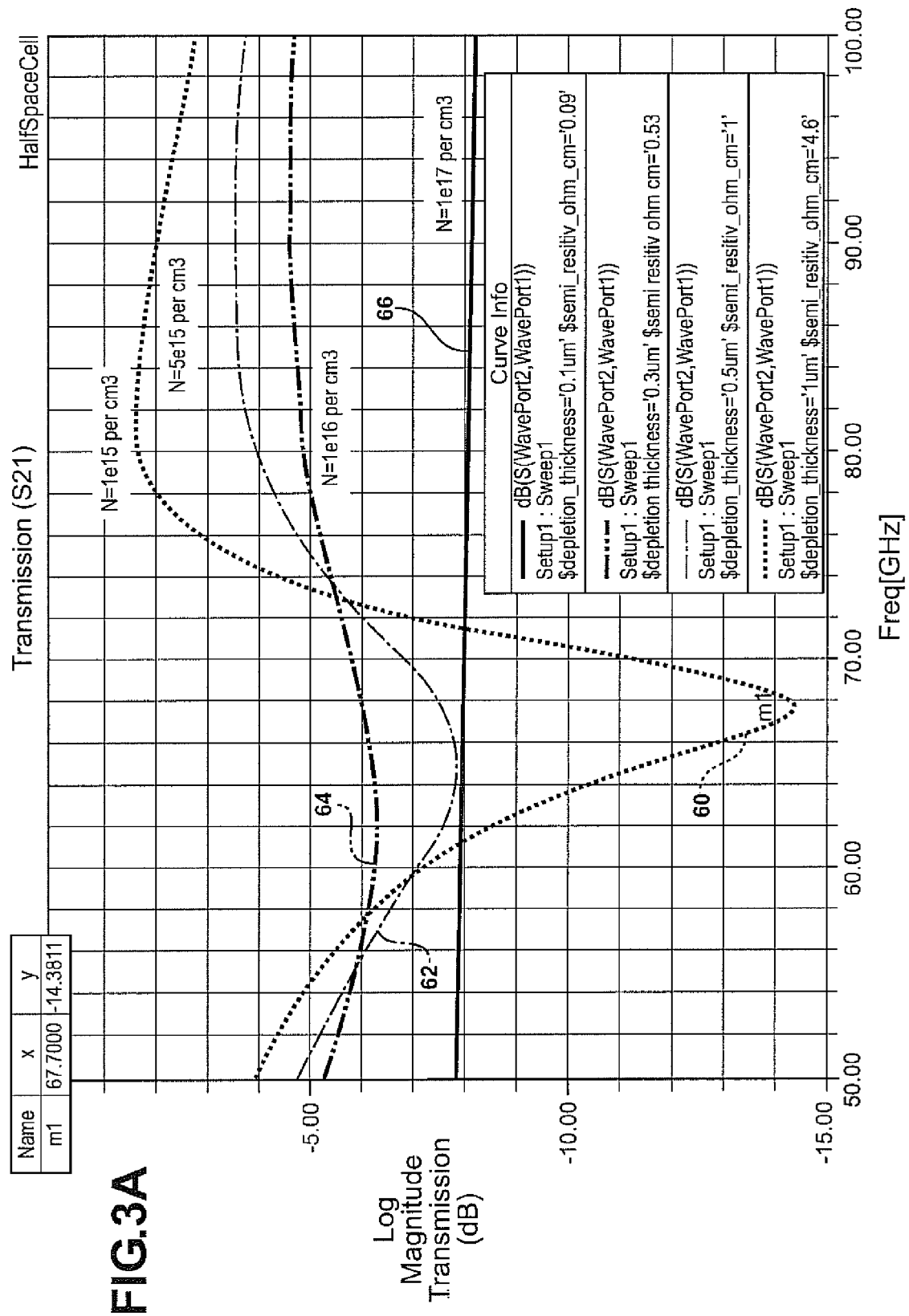
FIG. 3A shows electromagnetic transmission (S21) of a metamaterial as a function of frequency and carrier concentration for zero bias.

FIG. 3A shows electromagnetic transmission $S_{21}$ as a function of dopant concentration and frequency. The dopant concentrations vary between $10^{15}$ per cubic centimeter to $10^{17}$ per cubic centimeter as shown in curves 60, 62, 64, and 66 respectively. This curve represents zero bias voltage. For low levels of dopant concentration, the capacitive gap is not shorted out and resonance is occurred for example as shown at 60. However, for higher dopant concentrations, the capacitive gap is shorted out.

Figure 3B:
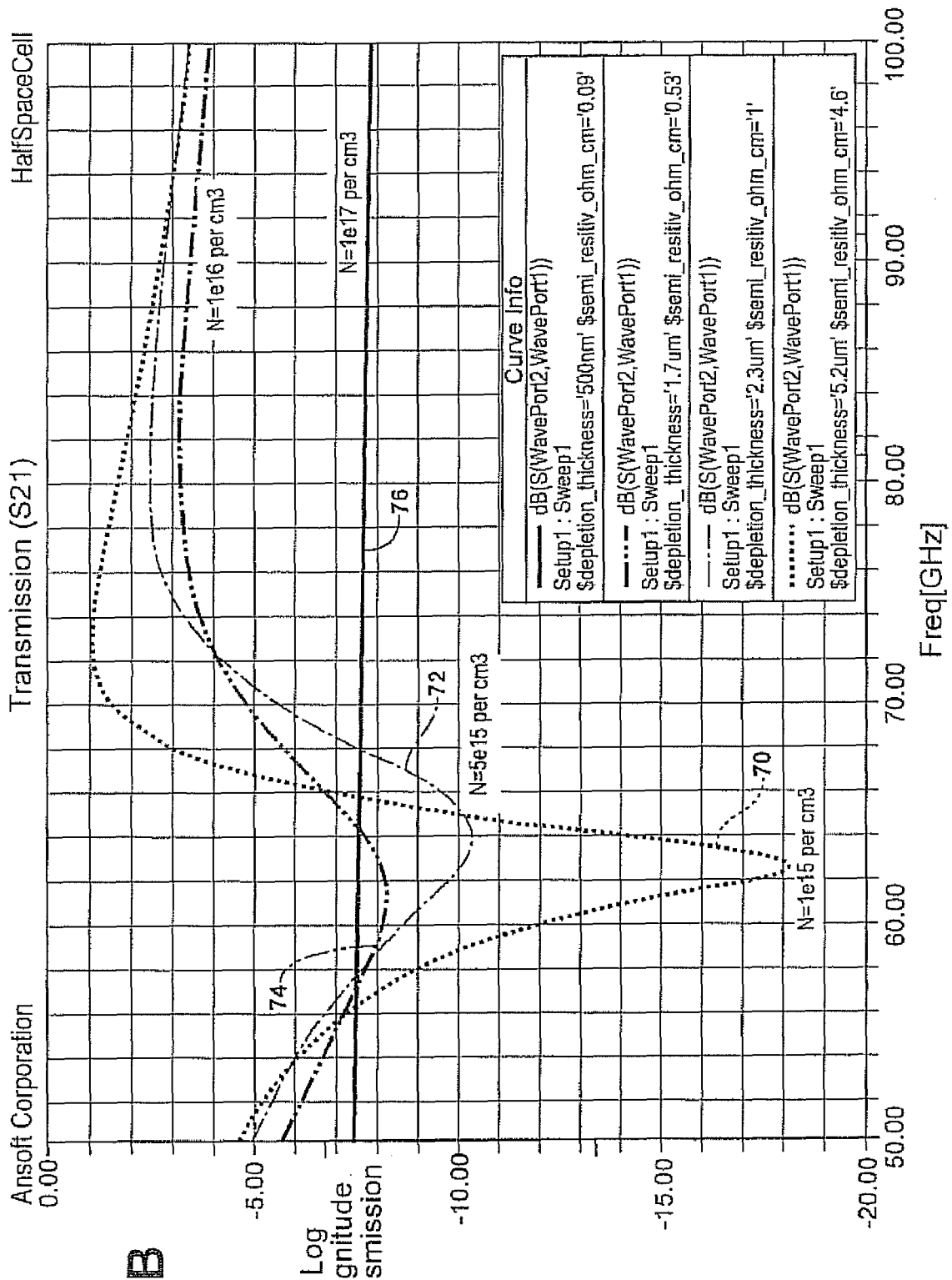
FIG. 3B shows transmission of a metamaterial for a bias of 20 volts.

FIG. 3B shows transmission $S_{21}$ as a function of frequency and carrier concentration for a 20 volt bias. The carrier concentrations correspond to those of FIG. 3A and are shown at 70, 72, 74, and 76 respectively. In this example, a distinct resonance is obtained for all carrier concentrations. The bias voltage tends to drive the charge carriers out of the capacitive gap, and the depletion region occupies more of the semiconductor region between the electrodes of the capacitive gap at the higher bias voltage.

Figure 4A:
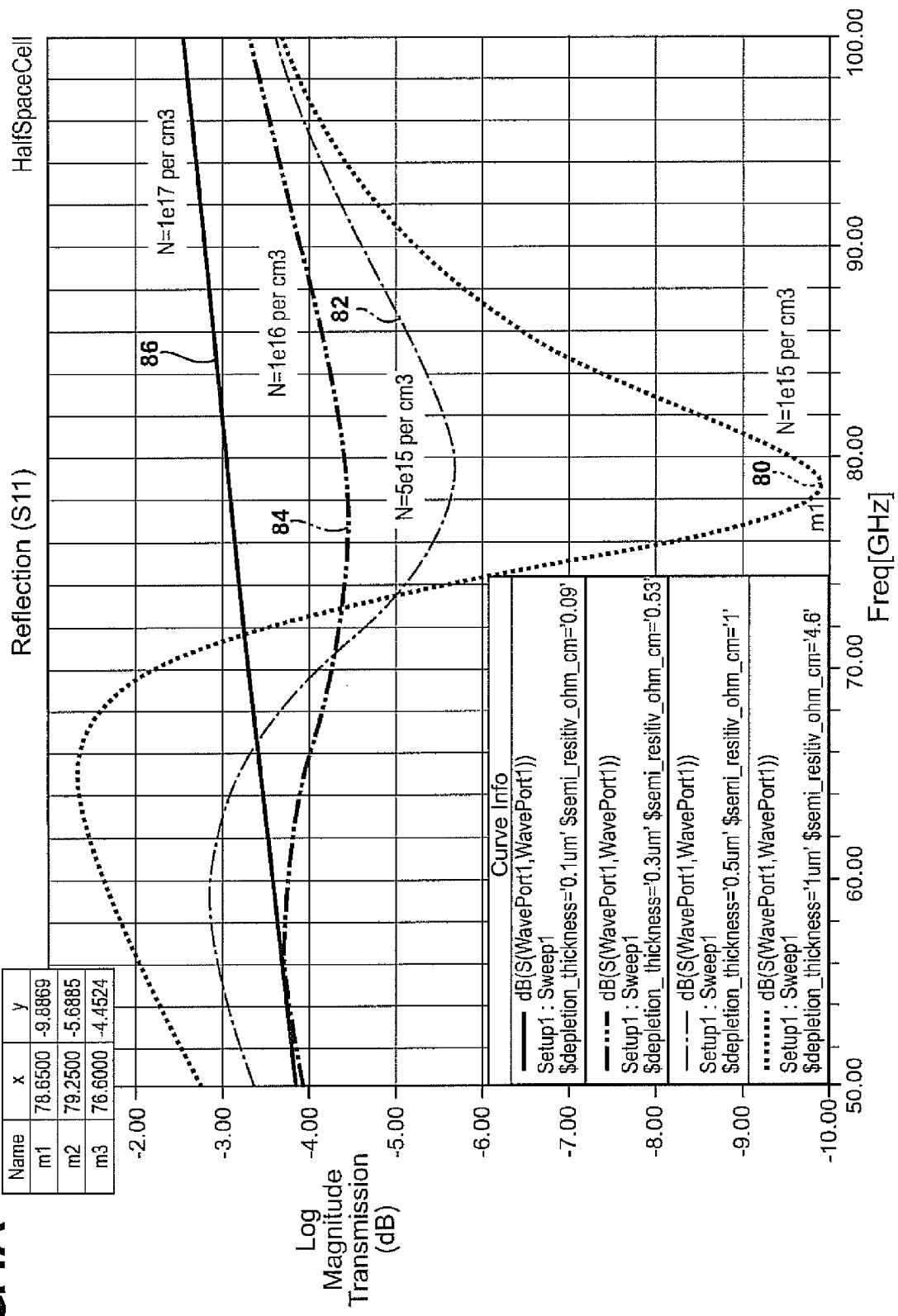
FIG. 4A shows electromagnetic reflection (S11) as a function of frequency and carrier concentration for zero bias.

FIG. 4A shows reflection $S_{11}$ as a function of frequency and carrier concentration, analogous to that shown in FIG. 3A. The reflection curves are shown at 80, 82, 84, and 86.

Figure 4B:
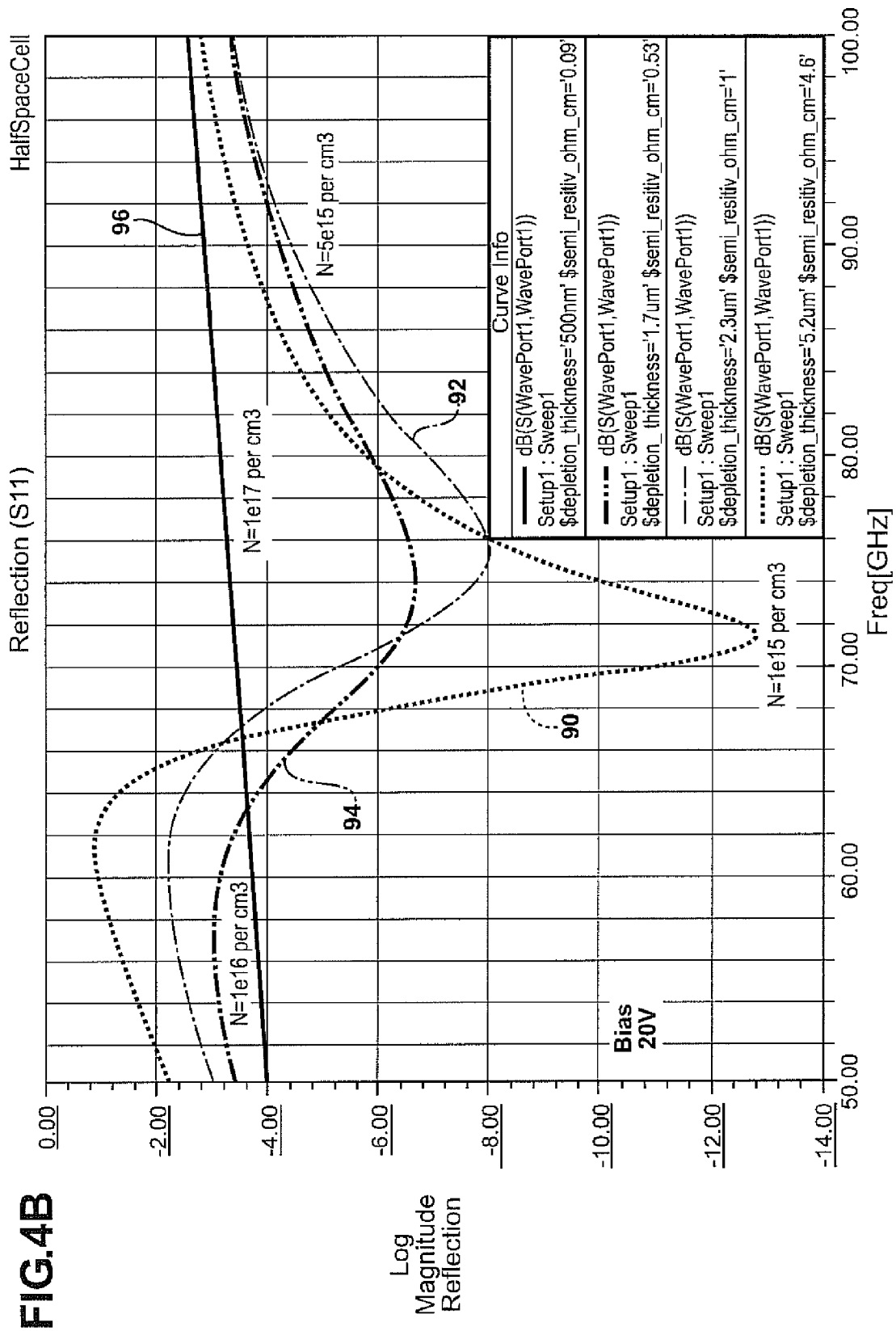
FIG. 4B shows reflection, for the same configuration as FIG. 4A, having a bias of 20 volts.

FIG. 4B shows reflection $S_{11}$ as a function of frequency and carrier concentration. The curves shown are 90, 92, 94, and 96, and the carrier concentrations are analogous to those shown in FIGS. 3A and 3B.

Hence, as shown in FIGS. 3A and 3B, and FIGS. 4A and 4B, reflection and transmission properties can be varied at any chosen frequency through variation in the carrier concentration or bias voltage. The dopant concentration is generally fixed, so that variations in resonator electromagnetic property are obtained through variation in the bias voltage. The dopant concentration can be selected so as to provide appreciable capacitor shorting at zero bias, possibly eliminating the resonance properties, and to provide an appreciably higher resistance between the capacitor electrodes at higher bias voltages, allowing observable resonance properties. A current carrier concentration (dopant concentration) between $10^{15}$ and $10^{17}$ per cubic cm may be used.

In some examples, the carrier concentration levels in the semiconductor layer can be adjusted using other effect, for example using ionization or recombination effects, to modify electromagnetic properties of the metamaterial. For example, carrier concentration variations can be obtained using external radiation incident on the semiconductor layer.

Figure 5A:
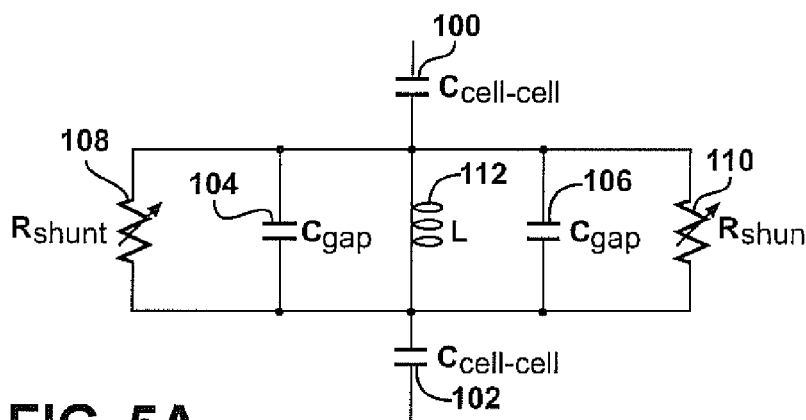
FIG. 5A shows an equivalent circuit for a modeled structure.

FIG. 5A shows an equivalent circuit for an example metamaterial. The equivalent circuit comprises inter-cell capacitors 100 and 102. These may not be appreciably changed through the application of a variable bias. The equivalent circuit also includes a self-inductance 112 and capacitors (provided by capacitive gaps) 104 and 106. Variable shunt resistances 108 and 110 correspond to the shunt resistance across the capacitive gap provided by the doped semiconductor layer. The shunt resistances can be increased, so that they contribute relatively little to the electromagnetic properties of the resonator through the application of bias voltage.

Figure 5B:
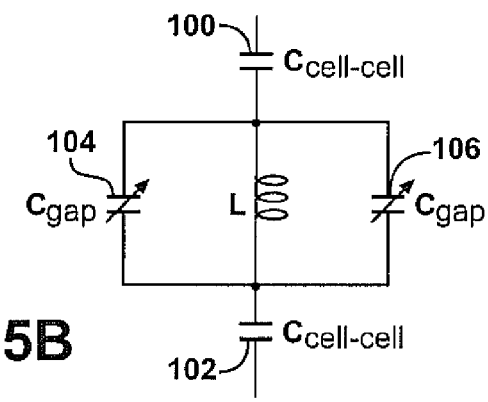
FIG. 5B shows an equivalent circuit with insignificant resistive components.

FIG. 5B is a simplified equivalent circuit corresponding to that of FIG. 5A, in which the shunt resistances have become high enough so as to have a generally negligible effect on the circuit. In this example the capacitor is adjusted through application of an electric field. This configuration may correspond to situations where a variable thickness depletion region is obtained between the capacitive gap electrodes, while at the same time the resistance between the electrodes is high enough to be neglected. A variable resonance frequency may be obtained using this approach.

Figure 6:
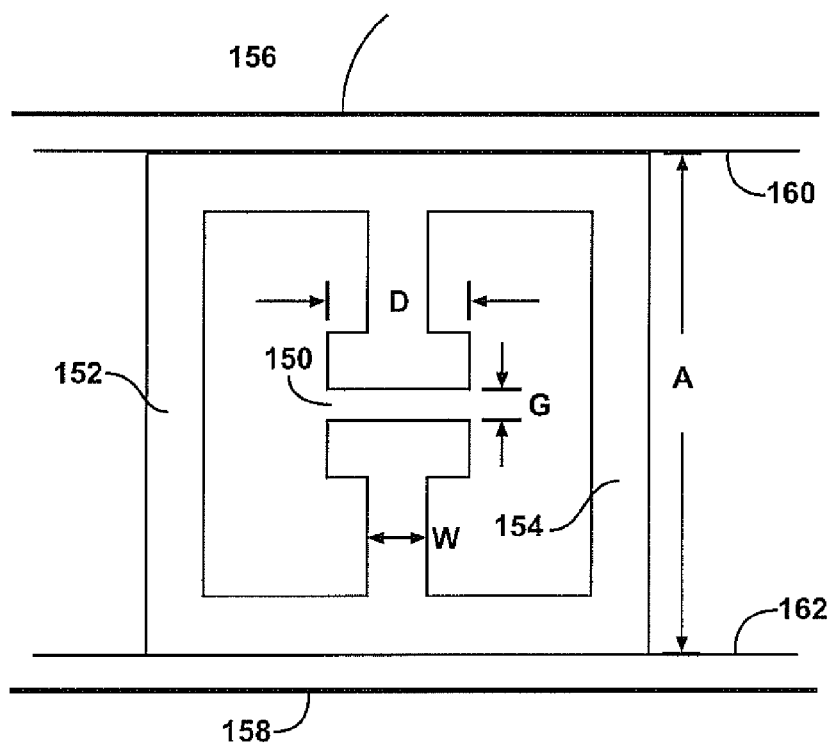
FIG. 6 shows another example resonator configuration.

FIG. 6 shows an alternative resonator having a capacitor (capacitive gap 150) and continuous outer arms 152 and 154, along with bias connections 156 and 158, and resonator electrical connections 160 and 162. The figure illustrates capacitive gap width G, resonator pattern central strip width W, capacitor electrode width D, and resonator outer dimension A.

In other examples, a resonator may be a generally ring-like structure including one or more capacitive gaps. The resonator is not limited to specific examples disclosed.

The simulation of metamaterial properties assumed totally depleted depletion regions, and rectangular depletion profiles with rounded corners. Example structures may be formed using a micron scale thickness of silicon supported on a support layer. For example, a silicon wafer may be bonded to a support material such as a Pyrex® wafer. The silicon may be then etched back using any appropriate process so as to leave a desired thickness remaining on the Pyrex® wafer. The composite substrate so obtained is relatively transparent, as the support material can be chosen for electromagnetic transparency or low loss at the operating frequency, whereas the semiconductor layer can be made thin enough that it does not significantly contribute to substrate loss. Further, nonessential parts of the semiconductor layer may be etched away to further remove losses. For example, semiconductor regions not proximate the capacitive gap (or required for contact with the bias connection) may be removed by etching.

In some examples of the present invention, the semiconductor layer has a thickness that is less than the thickness of the capacitive gap. For example, in examples simulated above, the capacitive gap was 5 microns, and the semiconductor layer thickness was 2 microns.

Example substrates may use any low loss material as the support layer, for example liquid crystal polymer.

Applications include active lens devices, radar antennas, and the like. In some examples, switched systems can be obtained, which may be switched between a resonator based metamaterial having a distinct resonance, and a composite having no resonance close to the operational frequencies.

Example metals that may be used to form the resonator include aluminum, silver, gold, copper, platinum and the like. Any metal may be used. Example semiconductor materials that can be used for the semiconductor layer include silicon, gallium arsenide, and silicon-germanium (SiGe).

In simulated examples, the resonator was formed by a 0.25 micron thickness of gold, with a thin chromium adhesion layer. However, the gold thickness may be increased, for example to 0.5 microns. For example, the metal thickness may be approximately equal to the skin depth, or some small multiple of the skin depth such as twice.

Examples of the present invention include a metamaterial comprising a metamaterial unit cell patterned in aluminum on top of a doped layer of semiconductor. An aluminum contact is patterned on top of the semiconductor in proximity to the metamaterial unit cell. The junction between the unit cell and the semiconductor forms a Schottky diode. By changing the magnitude of the bias voltage applied between the unit cell and a bias connection, the strength of the unit cell resonance can be controlled. This allow for the control of the material properties of the unit cell.

Further Discussion of Semiconductor Layer

The semiconductor layer may comprise a doped semiconductor, such as silicon, gallium arsenide (GaAs), indium phosphide (InP), or other semiconductor material. The semiconductor may be N or P type. In some examples, a semiconductor layer may comprise an organic semiconductor.

Further Discussion of Substrates

Substrates may be dielectric substrates, preferably low loss at the frequency range of operation. Substrates may be planar dielectric substrates. A possible dielectric substrate is Rogers Ultralam® 3000 series (Rogers Corporation, AZ) printed wiring boards (PWB). Example apparatus may comprise 1-50 layers, for example 20 metal layers, but the number of conducting layers and dielectric substrates is not limited by this example, and may be any number to obtain desired properties.

Substrates may comprise a polymer (such as a liquid crystal polymer), semiconductor (such as silicon, GaAs, and the like), glass (such as borosilicate glass, such as Pyrex®, in particular Pyrex® 7740 borosilicate glass, Corning, Inc., Corning, N.Y.), ceramic or glass-ceramic material, and the like.

For example, a support layer used in a metamaterial substrate may comprise one or more of the following: an organic material, such as an organic resin; a liquid crystal polymer (LCP); other polymeric material such as a sheet comprising a polymer, a composite, or other polymeric material; an inorganic material such as a ceramic, glass, composite; or other material or combination thereof.

For example, a support layer may comprise one or more of the following: a liquid crystal polymer (LCP) such as Rogers Ultralam® 3000 series LCP; a fluoropolymer-ceramic substrate, e.g. a micro-dispersed ceramic-PTFE composite such as CLTE-XT from Arlon, Cucamonga, Calif.; a PTFE glass fiber material such as Rogers RT/Duroid® 5880/RO 3003;

LTCC (Low Temperature Co-Fired Ceramic); a dielectric oxide such as alumina; a polyxylylene polymer such as parylene-N; a fluoropolymer, e.g. a polytetrafluoroethylene such as Teflon® (DuPont, Wilmington, Pa.), or other low-loss material at the frequency or frequency range of interest. A low loss material may have a dielectric loss less than 0.1 at an operating frequency, in some example one or more orders of magnitude less.

Further Discussion of Resonators and Conducting Patterns

Conducting patterns used to form resonators, bias lines, and the like may comprise electrically conducting films, for example metal films formed on a generally planar substrate. The substrate surface may include regions of semiconductor deposited on a support layer. Conducting segments may be etched or otherwise patterned from a conducting film. Conducting patterns may comprise a metal, such as a noble metal (for example, Pt or Au), a platinum group metal such as Pt, other transition metal, or other metal such as Al. Conducting patterns may comprise conducting alloys, conducting polymers, and the like.

Resonators may be arranged in an array with a generally repeating pattern having a unit cell. The unit cell dimension may be in the range 10 microns-1 mm, e.g. 100 microns-1 mm, for example approximately 300-600 microns on a square side. A resonator may have a generally square shape with a side length less than the unit cell dimensions. The track width of bias lines (used as bias connections) may be in the range 1 micron-500 microns, for example 10-100 microns. The capacitive gap thickness of capacitor(s) within a resonator may be in the range 0.5 microns-100 microns, for example in the range 1-20 microns, more particularly in the range 1-10 microns. The conducting film thickness (e.g. metal film thickness) of the conducting patterns may be in the range 0.1-10 microns. All ranges are inclusive.

Further Discussions of Applications

Metamaterials according to examples of the present invention may be used in apparatus such as electrically tunable gradient index lens for millimeter-wave radiation. A metamaterial lens may include a plurality of substrates, each substrate supporting an array of resonators. The resonators may have a parameter, such as resonance frequency, that varies as a function of position over the substrate(s). For example, the capacitor value, excluding the effect of any semiconductor layer, may vary with spatial position on the substrate, for example by varying the gap geometry. Resonators may be generally ring shaped, square shaped, or otherwise configured. Example applications also include millimeter wave sources and receivers, imaging devices, and radar apparatus of any kind.

Embodiments of the present invention include microwave applications, in particular millimeter wave devices for radar applications (including automotive radar applications), imaging applications, or other microwave and/or millimeter wave applications.

Examples of the present invention include metamaterials (artificial dielectric materials) for use in any millimeter-wave application, for example absorbers, reflectors, beam steering devices, and the like. Examples of the present invention include devices configured to function at millimeter-wave and/or microwave frequencies (for example, automotive radar frequencies of approximately 77 GHz). Example applications include elements for improved 77 gigahertz and 77-81 gigahertz automotive radars, and 94 GHz mm-wave imaging apparatus.

As the magnitude of a bias voltage is adjusted, the metamaterial unit cell effective electromagnetic properties at any designed operating frequency changes. The metamaterial can be used as a shutter or switch or to create an aperture for multimode radar system (e.g. switching between short, medium, and long range). A metamaterial can be polarization selective (and hence used as a polarizer), used as a beam steering device, phase shifter, and/or modulator.

Tunable metamaterials may be used for beam steering of electromagnetic beams, RF applications, phase shifter, adjustable lenses, polarizers, and other optical elements. In this context the term optical element refers to an element used to control electromagnetic radiation. This is not limited to optical wavelengths as the term is sometimes used but may also include IR, terahertz, and other radio wavelengths. Bias connections may comprise bias lines, for example a plurality of generally parallel conducting stripes which may also provide a polarizing effect on incident electromagnetic radiation.

Applications include electrically controlled beam steering for radar applications, for example, a metamaterial according to the present invention may be used in an automotive radar. The operating frequency may be approximately 77 gigahertz, or other suitable frequency. In such an application, the resonant frequency of any particular resonator may be selected to be somewhat less than the operational frequency, for example in the range of 40 to 60 gigahertz, so that the metamaterial acts as a positive refractive index material at the operating frequency. Any micro-fabrication technique may be used for fabrication of the metamaterials.

Example applications also include collision avoidance radar for an automobile. Other applications include reflectors, absorbers, switchable devices for example transforming from reflectors to absorbers, and other electromagnetic beam control devices such as beam steering devices. Active scanning of a radar beam is possible in one or more planes.

In some examples, beam steering devices may use bias voltages that vary as a function of position, for example from one column to an adjacent column so as to provide a variable index or gradient index lens. A gradient index lens may be used to modify the direction of a beam, such as a radar beam, and the beam may be dynamically scanned in one or more planes.

Beam steering devices (or other beam control devices) may be refractive, the beam to be steered passing through the beam steering device, for example from one face to another. Such a configuration is useful for automotive applications, for example adaptive cruise control, parking assistance, hazard recognition systems, and the like.

A control signal may include a plurality of bias voltages applied to rows and/or columns, or in some examples may be as a result of a direct drive scheme in which a potential is directly applied to a first conducting segment relative to second conducting segment connected to a grounded terminal. A two-dimensional variation of effective index may be obtained.

Active metamaterials allow beam steering using a low frequency control signal. A high resolution beam can be created by a combination of antenna and metamaterial lens, and the beam can be steered by actively changing an index gradient in the metamaterial lens.

A control signal for a tunable metamaterial may comprise a plurality of bias voltages. The magnitude of bias voltages may be controlled by a control circuit, for example comprising a processor, and may vary with time to allow dynamic control of a radar beam.

Example metamaterials may comprise a single substrate supporting resonators formed from conducting segments, or may be multilayered structure having a multiple substrates. A multilayer metamaterial may provide a three-dimensional arrangement of unit cells. In such examples a 3D variation of refractive index may be obtained.

Some examples of the present invention include metamaterials having planar ELC resonators. The metamaterial includes a plurality of unit cells each including a resonator electric circuit set upon a dielectric substrate. An example active ELC metamaterial resonator includes a thin film capacitor supported by a semiconductor layer. The variation of resonant frequency and resonance strength (Q-factor) with applied bias voltage allows a voltage controlled change of refractive index of the metamaterial. Bias connections can be configured so as not disturb electromagnetic wave propagation through the metamaterial, for example by being generally orthogonal to the electric field vector of the electromagnetic waves.

The invention is not restricted to the illustrative examples described above. Examples described are exemplary, and are not intended to limit the scope of the invention. Changes therein, other combinations of elements, and other uses will occur to those skilled in the art. The scope of the invention is defined by the scope of the claims.

Having described our invention, we claim:

1. A metamaterial, comprising:
    a substrate, the substrate including
        a support layer, the support layer being a dielectric layer, and
        a semiconductor layer, disposed on the support layer;
    a resonator, comprising a patterned electrically conducting film supported by the substrate,
        the resonator including a capacitor,
        the capacitor having at least one capacitor electrode forming a Schottky junction with the semiconductor layer;
    a resonator electrical connection, in electrical contact with the resonator; and
    a bias connection, in electrical contact with the semiconductor layer,
    so that a bias voltage applied between the bias connection and the resonator electrical connection modifies the electromagnetic properties of the resonator.

2. The apparatus of claim 1, wherein the support layer and the semiconductor layer are generally parallel planar layers in a multilayer substrate.

3. The apparatus of claim 1, the support layer being at least ten times thicker than the semiconductor layer.

4. The apparatus of claim 3, wherein the semiconductor layer has a thickness between 0.1 microns and 10 microns, inclusive.

5. The apparatus of claim 3, wherein the semiconductor layer has a thickness between 1 microns and 4 microns, inclusive.

6. The apparatus of claim 1, wherein the semiconductor layer comprises silicon.

7. The apparatus of claim 6, wherein the silicon has a dopant concentration of between $10^{15}$ and $10^{17}$ per cubic centimeter.

8. The apparatus of claim 1, wherein the support layer comprises a glass.

9. The apparatus of claim 1, wherein the support layer comprises a liquid crystal polymer.

10. The apparatus of claim 1, wherein the resonator comprises an electrically coupled inductor capacitor (ELC) resonator comprising a patterned metal film.

11. The apparatus of claim 10, wherein the resonator, bias connection, and the resonator electrical connection comprise generally coplanar metal films.

12. The apparatus of claim 10, the capacitor having a capacitive gap having a capacitive gap width,
    the semiconductor layer having a thickness less than the capacitive gap width.

13. The apparatus of claim 12, the semiconductor layer being a patterned layer, the semiconductor layer being disposed proximate the capacitive gap.

14. A metamaterial, comprising:
    a substrate, the substrate including a support layer and a semiconductor layer,
        the support layer comprising a dielectric material,
        the semiconductor layer being a doped semiconductor layer having a spatial distribution of charge carriers;
    a resonator, comprising a patterned metal film supported by the substrate,
        at least part of the resonator forming a Schottky junction with the semiconductor layer;
    a resonator electrical connection, supported by the substrate, in electrical contact with the resonator; and
    a bias connection, supported by the substrate, the bias connection being in electrical contact with the semiconductor layer,
    a bias voltage applied between the bias connection and the resonator electrical connection modifying the electromagnetic properties of the resonator by changing the spatial distribution of charge carriers within the semiconductor layer.

15. The apparatus of claim 14, the resonator including a capacitor having capacitor electrodes, at least one capacitor electrode forming a Schottky junction with the semiconductor layer.

16. The apparatus of claim 14, wherein the semiconductor layer has a semiconductor layer thickness,
    the support layer having a support layer thickness,
    the support layer thickness being at least ten times greater than the semiconductor layer thickness.

17. The apparatus of claim 14, the metamaterial comprising a plurality of resonators arranged in an array on the substrate.

18. The apparatus of claim 17, the bias connection and the resonator electrical connection being used to control electromagnetic properties of a group of resonators within the plurality of resonators.

19. The apparatus of claim 14, wherein the support layer is a borosilicate glass, and the semiconductor layer comprises doped silicon.

20. The apparatus of claim 14, the metamaterial being a component of an automotive radar.

21. The apparatus of claim 14, the resonator having at least a first state and a second state,
    the capacitor being effectively shorted out by the semiconductor layer in the first state,
    the capacitor not being shorted out by the semiconductor layer in the second state, the magnitude of the bias voltage being adjustable so as to select the first state or the second state.

22. A method of adjusting electromagnetic properties of a metamaterial, the metamaterial including a plurality of resonators supported on a substrate, the substrate including a dielectric support layer and a semiconductor layer, the dielectric support layer being at least ten times thicker than the semiconductor layer, the method including:

modifying a charge carrier distribution within a region of the semiconductor layer proximate a capacitive gap of at least one resonator by adjusting a bias voltage between the at least one resonator and the semiconductor layer, so as to adjust the electromagnetic properties of the metamaterial.

23. The method of claim 22, the plurality of resonators being electrically coupled inductor-capacitor (ELC) resonators, the dielectric support layer being a polymer or a glass.

* * * * *